US010249170B1

(12) United States Patent
Huang et al.

(10) Patent No.: US 10,249,170 B1
(45) Date of Patent: Apr. 2, 2019

(54) AUTO ALERT FOR SERVER IN RACK DUE TO ABUSIVE USAGE

(71) Applicant: Dell Products L.P., Hopkinton, MA (US)

(72) Inventors: Chih-Wen Huang, Taoyuan (TW);
Chih-Chieh Ting, Taipei (TW);
Chu-Pei Tsao, New Taipei (TW);
Ching-Yuan Pai, New Taipei (TW);
Mao-Chen Wu, Taipei (TW);
Tung-Sen Huang, New Taipei (TW)

(73) Assignee: Dell Products L.P., Hopkinton, MA (US)

( * ) Notice: Subject to any disclaimer, the term of this patent is extended or adjusted under 35 U.S.C. 154(b) by 0 days.

(21) Appl. No.: 15/961,427

(22) Filed: Apr. 24, 2018

(51) Int. Cl.
G08B 21/00 (2006.01)
G08B 21/18 (2006.01)
H05K 7/14 (2006.01)
G01L 1/00 (2006.01)

(52) U.S. Cl.
CPC ............ G08B 21/182 (2013.01); G01L 1/005 (2013.01); H05K 7/1489 (2013.01); H05K 7/1498 (2013.01)

(58) Field of Classification Search
CPC .... G08B 21/182; G01L 1/005; H05K 7/1489; H05K 7/1498
USPC ........................................................ 340/665
See application file for complete search history.

(56) References Cited

U.S. PATENT DOCUMENTS

| 7,222,127 | B1 | 5/2007 | Bem et al. |
| 7,516,362 | B2 | 4/2009 | Connelly et al. |
| 7,987,353 | B2 | 7/2011 | Holdaway et al. |
| 8,386,930 | B2 | 2/2013 | Dillenberger et al. |
| 8,401,982 | B1 | 3/2013 | Satish et al. |
| 8,583,769 | B1 | 11/2013 | Peters et al. |
| 8,868,987 | B2 | 10/2014 | Wagner |
| 8,874,892 | B1 | 10/2014 | Chan et al. |
| 9,122,501 | B1 | 9/2015 | Hsu et al. |
| 9,201,751 | B1 | 12/2015 | Muthirisavenugopal et al. |
| 9,278,481 | B2 | 3/2016 | Hull |
| 9,355,036 | B2 | 5/2016 | Beard et al. |
| 9,898,224 | B1 | 2/2018 | Marshak et al. |
| 10,057,184 | B1 | 8/2018 | Prahlad et al. |
| 10,097,620 | B2 | 10/2018 | Reddy et al. |
| 2004/0088145 | A1* | 5/2004 | Rosenthal ............. G06F 17/509 703/1 |
| 2006/0178864 | A1* | 8/2006 | Khanijo ................ G06F 13/409 703/20 |

(Continued)

OTHER PUBLICATIONS

"Integrated Dell Remote Access Controller 8 (iDRAC8)", Version 2.05.05.05 User's Guide, Dell Inc., Dec. 2014 (348 pages).

(Continued)

Primary Examiner — Naomi J Small
(74) Attorney, Agent, or Firm — Chamberlain, Hrdlicka, White, Williams & Aughtry

(57) ABSTRACT

A computing device includes a rail mount chassis and a processor. The rail mount chassis includes a pressure sensor. The processor monitors the pressure sensor to obtain pressure sensor data; estimates a load exerted on a rail of the rail mount chassis using the obtained pressure sensor data; makes a determination that the load exerted on the rail exceeds a load rating of the rail; and in response to the determination, notifies a user that the rail may be damaged.

20 Claims, 20 Drawing Sheets

(56) References Cited

U.S. PATENT DOCUMENTS

| | | | | |
|---|---|---|---|---|
| 2012/0182151 | A1* | 7/2012 | Tong | H05K 7/1498 340/666 |
| 2014/0069291 | A1* | 3/2014 | Yang | B61B 13/00 104/106 |
| 2015/0256394 | A1* | 9/2015 | Palmer | H04L 12/10 709/221 |
| 2016/0048611 | A1* | 2/2016 | Cox | G06F 17/5004 703/1 |
| 2016/0302323 | A1* | 10/2016 | Gosselin | B23P 19/04 |

OTHER PUBLICATIONS

Iler, Doug, et al., "Introducing iDRAC8 with Lifecycle Controller for Dell 13th Generation PowerEdge Servers", A Dell Deployment and Configuration Guide, Dell Inc., Sep. 2014 (16 pages).

* cited by examiner

AUTO ALERT FOR SERVER IN RACK DUE TO ABUSIVE USAGE

BACKGROUND

Computing devices may include any number of internal components such as processors, memory, and persistent storage. Each of the internal components may operate with other components of the computing devices. For example, some processors store generated data in a persistent storage and may utilize capacity of the memory to perform computations.

Computing devices may be housed in chassis. A chassis may be an enclosure. Some chassis may be designed to be mounted in a structure, such as a frame, that hosts many chassis. Frames may host numerous chassis. Chassis may be mounted to structures using different types of mount systems. Some mounting systems enables chassis to be partially exposed from the frame. By partially exposing the frame, a user my access the computing device, or other component, disposed within the frame.

SUMMARY

In one aspect, a computing device in accordance with one or more embodiments of the invention includes a rail mount chassis and a processor. The rail mount chassis includes a pressure sensor. The processor monitors the pressure sensor to obtain pressure sensor data; estimates a load exerted on a rail of the rail mount chassis using the obtained pressure sensor data; makes a determination that the load exerted on the rail exceeds a load rating of the rail; and in response to the determination, notifies a user that the rail may be damaged.

In one aspect, a coordination point in accordance with one or more embodiments of the invention includes a persistent storage and a processor. The persistent storage stores load policies. The processor obtains a notification from a rail mount chassis; makes a determination that the pressure sensor data exceeds a pressure rating of a rail of the rail mount chasses; and, in response to the determination, performs a remediation action using the load policies. The notification includes pressure sensor data generated by a sensor of the rail mount chassis.

In one aspect, a method in accordance with one or more embodiments of the invention includes monitoring a pressure sensor of a rail mount chassis to obtain pressure sensor data; estimating a load exerted on a rail of the rail mount chassis using the obtained pressure sensor data; making a determination that the estimated load exerted on the rail exceeds a load rating of the rail; and, in response to the determination, performing a remediation action.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for improving the reliability of computing devices in a data center. Embodiments of the invention may improve the reliability of the computing devices by automatically detecting potential damage to the computing devices caused by loads applied to the chassis of the computing devices. In a data center scenario, the chassis may be, for example, rail mount chassis. The chassis may be other types of chassis without departing from the invention.

In one or more embodiments of the invention, a system automatically performs remediation actions in response to the detections of potential damage caused by loads applied to chassis. The remediation may be, for example, generating a notification. The notification may be, for example, the display of a light pattern using a light emitting device of a chassis, the display of a sound or other audio signal using a sound emitting device of a chassis, and/or sending a notification to a predetermined user. By notifying a user, either directly through a notification or indirectly through the display of light or other stimuli, damage to computing device may be identified at the time the damage occurred and, consequently, enable it to be detected and repair.

Figure 1:
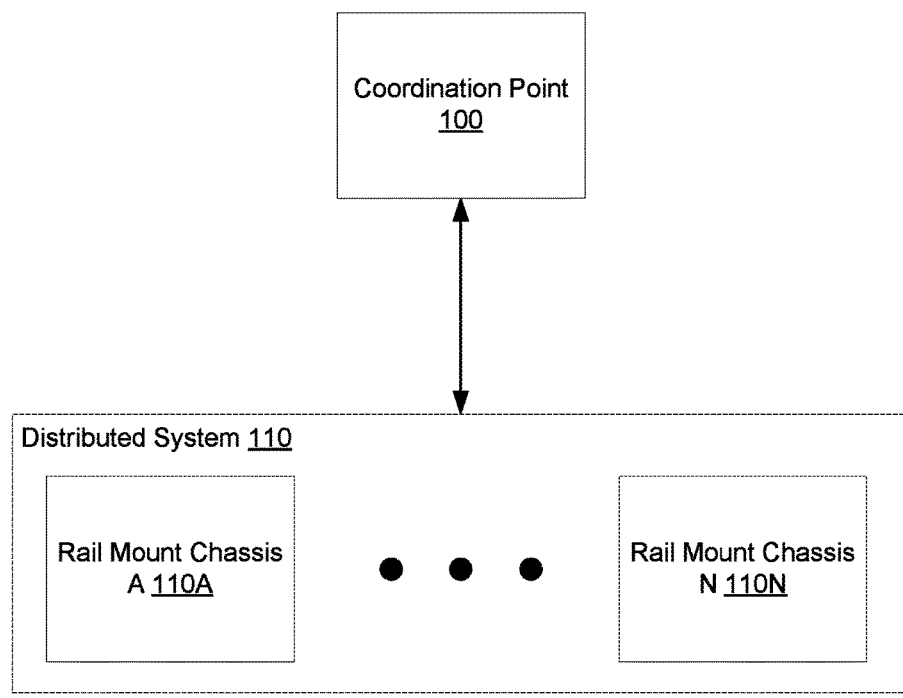
FIG. 1 shows a diagram of a system in accordance with one or more embodiments of the invention.

FIG. 1 shows a system in accordance with one or more embodiments of the invention. The system may include a coordination point (100) operably connected to a distributed system (110). The distributed system (110) may include a number of rail mount chassis (110A, 110N). The rail mount chassis may house computing devices such as, for example, services, network switches, power supplies, or other electronic components. Each of the components of the system may be operably connected to each other using any combination and quantity of wired and/or wireless networks. Each component of the system is discussed below.

In one or more embodiments of the invention, a rail mount chassis (110A, 110N) is a physical device that houses electronic components such as, for example, servers, network switches, power supplies, or other electronic components. The rail mount chassis (110A, 110N) may be smart devices that monitor pressure applied to the respective chassis. The monitoring of the pressure may enable the likelihood of damage being done to the respective rail mount chassis, or components disclosed therein or nearby, to be determined. Remediation actions may be performed when the monitoring of the pressure indicates that there is a likelihood of damage being caused by the monitored pressure. The remediation actions may include, for example, displaying a light, playing a sound, or sending a notification to a user. Other remediation actions may be performed without departing from the invention.

In one or more embodiments of the invention, the rail mount chassis (110A, 110N) may include or be operably connected to a computing device. The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of each rail mount chassis (e.g., 110A, 110N) described throughout this application and/or all, or a portion thereof, of the methods illustrated in FIGS. 5A-5D. For additional details regarding the rail mount chassis, See FIG. 2A. For additional details regarding computing devices, See FIG. 8.

In one or more embodiments of the invention, the coordination point (100) manages the distributed system (110). The coordination point (100) may manage the distributed system by obtaining notifications from the rail mount chassis (110A, 110N) of a distributed system (110) and performing remediation actions based on the notifications obtained. The notifications may include pressure sensor data applied to the rail mount chassis (110A, 110N). Remediation actions may include notifying a user of statistically different pressure sensor data from one rail mount chassis of the rail mount chassis (110A, 110N) relative to other rail mount chassis (110A, 110N) in the distributed system (110). Other remediation actions may be performed without departing from the invention.

In one or more embodiments of the invention, the coordination point (100) is implemented as a computing device. The computing device may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to perform the functions of the coordination point (100) described throughout this application and/or all, or a portion thereof, of the methods described in FIGS. 6A-6D. For additional details regarding the coordination point, See FIG. 3. For additional details regarding computing devices, See FIG. 8.

While the system of FIG. 1 has been illustrated as including a limited number of components for the sake of brevity, the system may include additional components (not shown), fewer components, and/or different components (not shown) without departing from the invention.

Figure 2A:
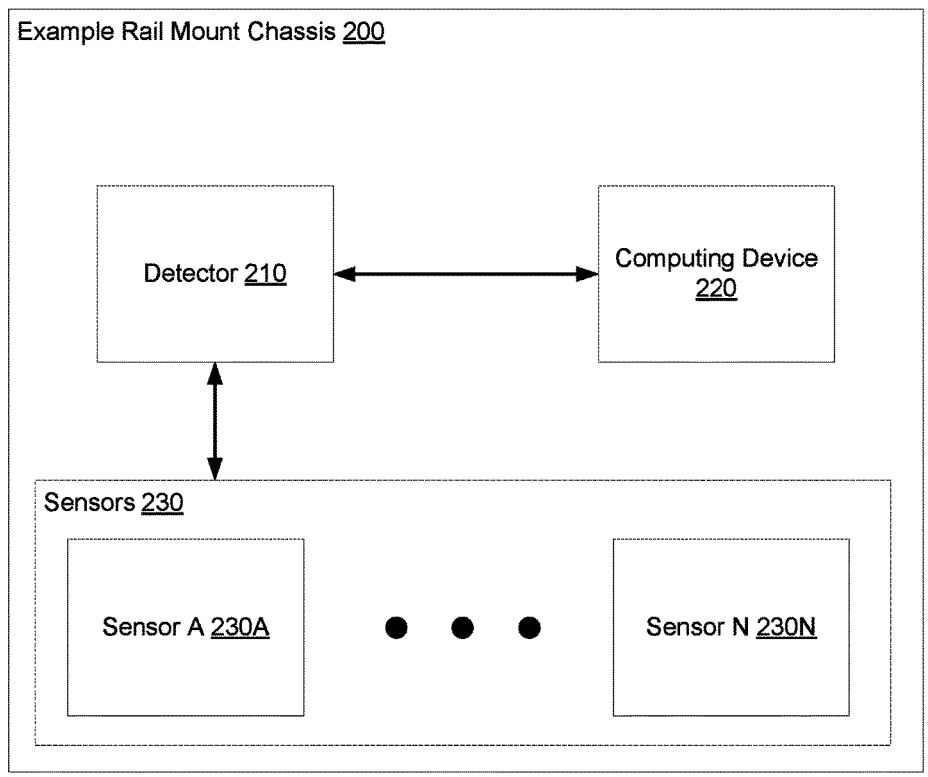
FIG. 2A shows a diagram of an example rail mount chassis in accordance with one or more embodiments of the invention.

FIG. 2A shows a diagram of an example rail mount chassis (200) in accordance with one or more embodiments of the invention. The example rail mount chassis (200) may be similar to the rail mount chassis (110A, 110N, FIG. 1) discussed above. As discussed above, the example rail mount chassis (200) may obtain measurements of pressure applied to the respective chassis and perform remediation actions based on the measurements. To perform the aforementioned functionality, the example rail mount chassis (200) may include sensors (230), a detector (210), and a computing device (220). Each of the components is discussed below.

In one or more embodiments of the invention, the detector (210) monitors the sensors (230) in the example rail mount chassis (200). The detector (210) may monitor the sensors (230) by obtaining pressure sensor data from the sensors (230) and sending the pressure sensor data to the computing device (220).

The pressure sensor data may be digital or analog information obtained from the sensors (230) that corresponds to the amount of pressure applied to the sensors (230). The pressure sensor data may estimate a load applied to the example rail mount chassis (200). The load may be estimated by converting the obtained pressure sensor data to an estimate of pressure applied to the example rail mount chassis (200), e.g., an estimated load applied to the example rail mount chassis (200). The estimate of the applied load may be sent to the computing device (220).

In one or more embodiments of the invention, the detector (210) is a physical device. The physical device may include circuitry. The physical device may be, for example, a field-programmable gate array, application specific integrated circuit, programmable processor, microcontroller, digital signal processor, or other hardware processor. The physical device may include analog to digital conversion circuitry to convert signals received from the sensors to digital data. The physical device provide the functionality of the detector (210) described throughout this application and/or all or a portion of the methods illustrated in FIGS. 5A-5E.

In one or more of embodiments of the invention, the detector (210) is implemented as computer instructions, e.g. computer code, stored on a persistent storage that when executed by a processor of the example rail mount chassis (200) cause the example rail mount chassis (200) to provide the functionality of the detector (210) described throughout the application and/or all or a portion of the methods illustrated in FIGS. 5A-5E.

In one or more embodiments of the invention, the computing device (220) obtains an estimate of an applied load and determines whether remediation actions are to be performed. The estimate of an applied load may be obtained from the detector (210). The computing device (220) may perform remediation actions based on the estimate of the applied load. Remediation actions may include sending the estimate of the applied load to a coordination point (e.g., 100, FIG. 1) or activating an audio/visual signal capability of the computing device (220) or other device.

In one or more embodiments of the invention, the computing device (220) includes one or more processors, memory (e.g., random access memory), and persistent storage (e.g., disk drives, solid state drives, etc.). The persistent storage may store computer instructions, e.g., computer code, that when executed by the processor(s) of the computing device cause the computing device (220) to provide the functionality of the example rail mount chassis (200) described throughout this application and/or all or a portion of the methods illustrated in FIGS. 5A-5E.

In one or more embodiments of the invention, the sensors (230) measure pressure applied to the sensors (230) and generate pressure sensor data based on the measured pressure. The measurements of pressure may be stored as pressure sensor data. The pressure sensor data may be obtained by the detector (210) to be analyzed.

In one or more embodiments of the invention, the sensors (230) are physical devices. The physical devices may include circuitry. The physical device include, for example, a piezoelectric pressure sensor that generates an electric charge proportional to the strain produced on a material from applied pressure, a strain gauge that relates the pressure applied on a component to the electric resistance of the component, and other components for converting the changes in sensing components of the sensors to electrical signals. The sensors may other types of sensing elements without departing from the invention.

While the example rail mount chassis (200) of FIG. 2A has been illustrated as including a limited number of components for the sake of brevity, the system may include additional components (not shown), fewer components, and/or different components (not shown) without departing from the invention.

To further clarify aspects of the example rail mount chassis (200) disclosed here, FIGS. 2B-2F illustrate diagrams of rail mount chassis in connection with other components.

Figure 2B:
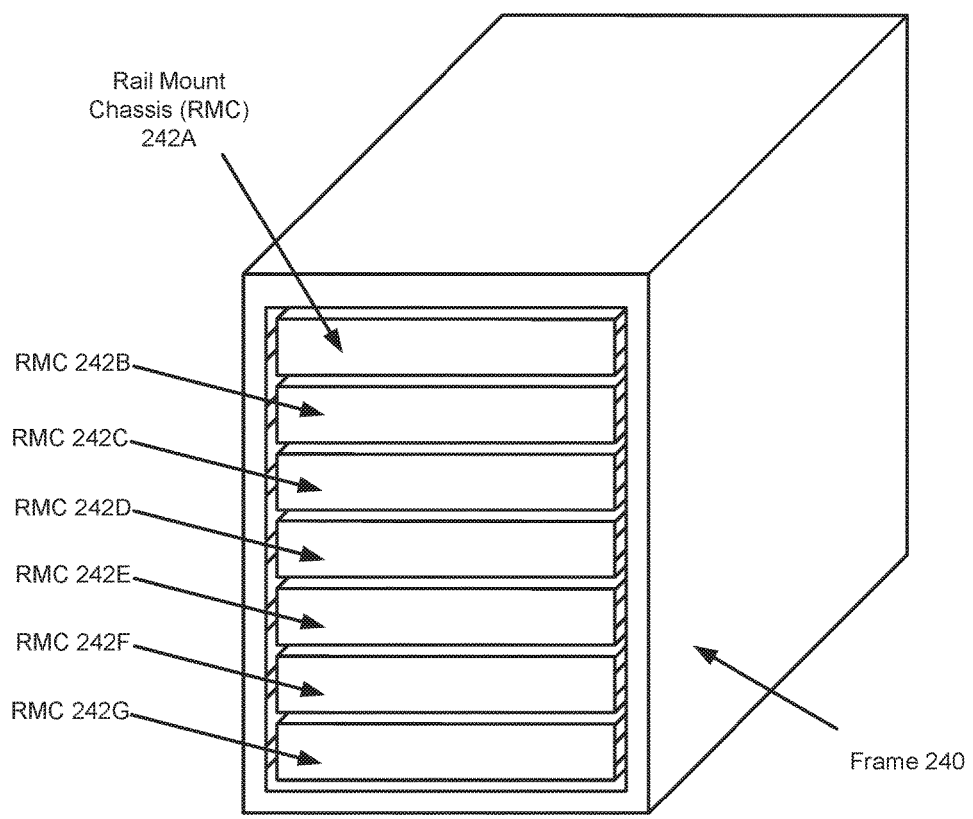
FIG. 2B shows a diagram of an example of rail mount chassis in a frame in accordance with one or more embodiments of the invention.

FIG. 2B shows a diagram of rail mount chassis housed in a frame (240) in accordance with one or more embodiments of the invention. The frame (240) may be a mechanical structure for housing rail mount chassis (RMC) (242A, 242B, 242C, 242D, 242E, 242F, 242G).

In one or more embodiments of the invention, the frame (240) includes rails on which rail mount chassis (242A, 242B, 242C, 242D, 242E, 242F, 242G) are mounted. The rails may allow each rail mount chassis (242A, 242B, 242C, 242D, 242E, 242F, 242G) to move in and out of the frame (240) along a predetermined path. For additional details regarding the rails and movement of rail mount chassis into and out of the frame, See FIGS. 2C and 2D.

Figure 2C:
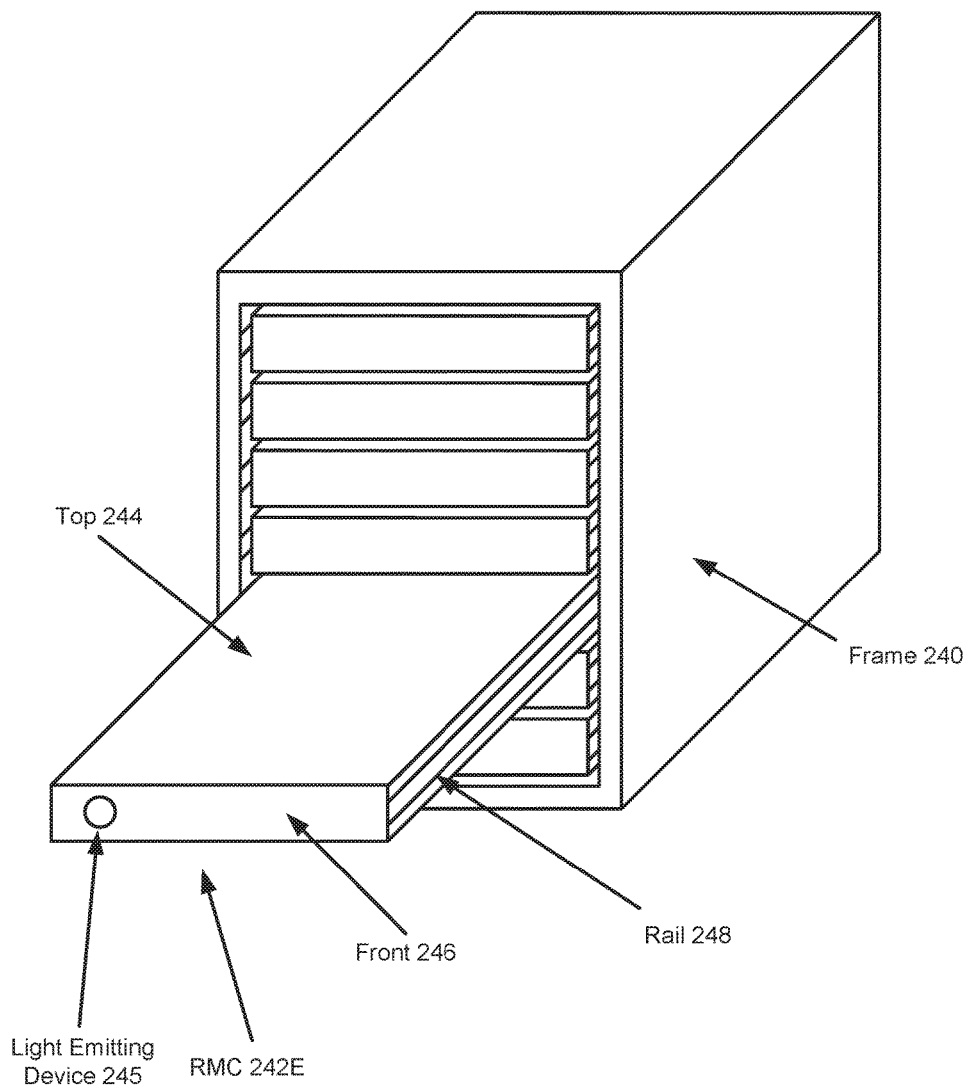
FIG. 2C shows a diagram of a rail mount chassis partially exposed in a frame in accordance with one or more embodiments of the invention.

FIG. 2C shows a diagram, similar to that of FIG. 2B, where a rail mount chassis has been moved out of the frame (240) via rails (248) in accordance with one or more embodiments of the invention.

In one or more embodiments of the invention, the rail mount chassis (242E) includes a light emitting device (245) on a front (246) portion. The light emitting device (245) may be capable of displaying light patterns. The light emitting device (245) may be, for example, a light emitting diode or liquid crystal display. The light emitting device (245) may be other types of devices without departing from the invention.

In one or more embodiments of the invention, the light emitting device (245) is operably coupled to a computing device of the rail mount chassis (242E). The light emitting device (245) may receive instructions from the computing device. Thus, the computing device may be capable of causing the light emitting device (245) to emit light.

In one or more embodiments of the invention, the rail (248) is a mechanical device that mechanically couples the rail mount chassis (242E) to the frame. The rail (248) may include rollers, or other mechanically elements, that enable the rail mount chassis (242E) to move along a predetermined path. In the example shown in FIG. 2C, the path is a linear path.

As seen in FIG. 2C, since the light emitting device (245) is disposed on the front (246), the light emitting device may be capable of emitting light to the area surrounding and thereby notify persons near the frame (240). For example, the light emitting device (245) may emit different patterns of light to communicate to nearby persons that there is a problem with the rail mount chassis (242E), or computing device disposed therein.

While in FIG. 2C the rail mount chassis (242E) is illustrated at being mechanically coupled to the frame (240) via a rail (248), other devices may be used to mechanically couple the rail mount chassis (242E) to the frame (240) without departing from the invention.

Figure 2D:
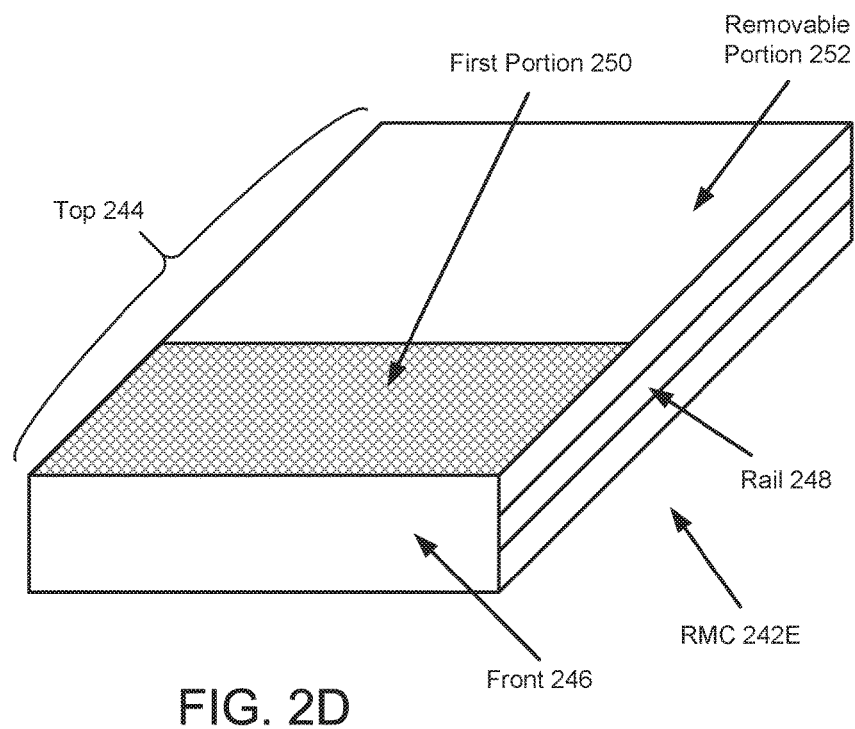
FIG. 2D shows a diagram of a top of an example of rail mount chassis in accordance with one or more embodiments of the invention.

FIG. 2D shows a diagram of a rail mount chassis (242E) in accordance with one or more embodiments of the invention. The orientation of the rail mount chassis (242E) in FIG. 2D may be similar to the orientation of the rail mount chassis (242E) in FIG. 2C. The top (244) of the rail mount chassis (242E) may include a first portion (250) and a removable portion (252).

In one or more embodiments of the invention, the first portion (250) is the area of the rail mount chassis (242E) that is not intended to be removed from the rail mount chassis (242E). In contrast, the removable portion (252) may include parts that can be removed from the rail mount chassis (242E). Removing the removable portion (252) may expose components disposed within the rail mount chassis (242E). The removable portion (252) may be, for example, a cover connected via removable bolts, screws, or other fasteners. The removable portion (252) may be other mechanical devices without departing from the invention.

In one or more embodiments of the invention, the first portion (250) may be a portion of the top adjacent to a front of the rail mount chassis (242E). The first portion (250) may be mechanically coupled to sensors that measure pressure applied to the first portion (250). Thus, if pressure is applied to the first portion (250) the sensors coupled to the first portion (250) may detect the applied pressure and thereby enable the detection of pressure applied to the rail mount chassis (242E). The first portion (250) may be, for example, a plate that is coupled to sensors. The first portion (250) may be other types of mechanical devices without departing from the invention. For additional details regarding sensors, See FIG. 2E.

Figure 2E:
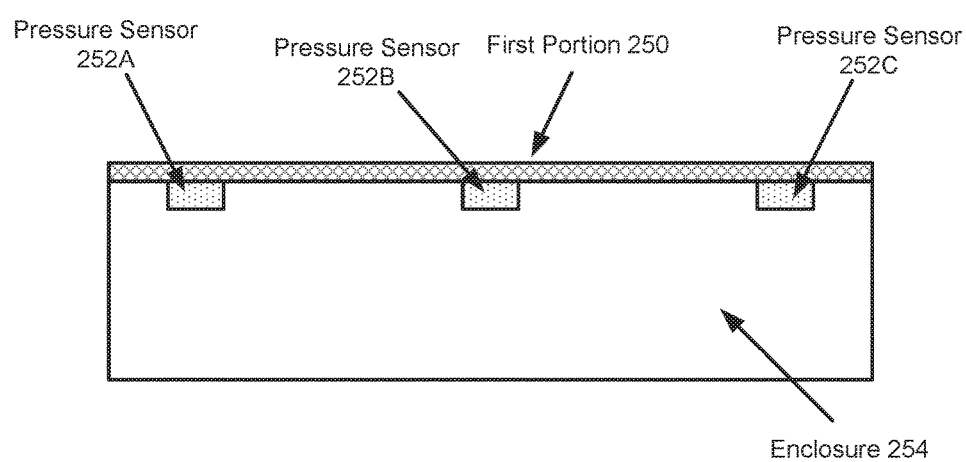
FIG. 2E shows a diagram of a side of an example of rail mount chassis in accordance with one or more embodiments of the invention.

FIG. 2E shows a diagram of an example placement of pressure sensors (252A, 252B, 252C) on a rail mount chassis in accordance with one or more embodiments of the invention. The orientation of the diagram may be the front view of the rail mount chassis of FIG. 2D. The pressure sensors (252A, 252B, 252C) may be similar to the sensors (230, FIG. 2A) discussed above.

As discussed above, the pressure sensors (252A, 252B, 252C) may detect pressure. The pressure sensors (252A, 252B, 252C) may be located between an enclosure (254) and the first portion (250) and mechanically coupled to the first portion (250). Thus, the pressure sensors (252A, 252B, 252C) may measure pressure applied to the first portion (150).

In one or more embodiments of the invention, the enclosure (254) is a volume within the rail mount chassis (242E) for housing components. The enclosure (254) may be, for example, a sheet metal box. The pressure sensors may be disposed between portions of the enclosure (254) and the first portion (250) and thereby enable pressure applied to the first portion to be measured by the pressure sensors.

In one or more embodiments of the invention, a pressure sensors (252A, 252B, 252C) measures pressure by measuring the strain produced by the pressure sensor when pressure is applied to the first portion (250). The measured strain of each pressure sensor (252A, 252B, 252C) may be converted to an electric signal. The electric signal may be sent to a computing device (not shown) of the rail mount chassis, or elsewhere, for processing.

While the pressure sensors shown in FIG. 2E are illustrated as being disposed below the first portion, the pressure sensors may be disposed at other locations without departing from the invention. For additional details regarding the placement of pressure sensors, See FIG. 2F.

Figure 2F:
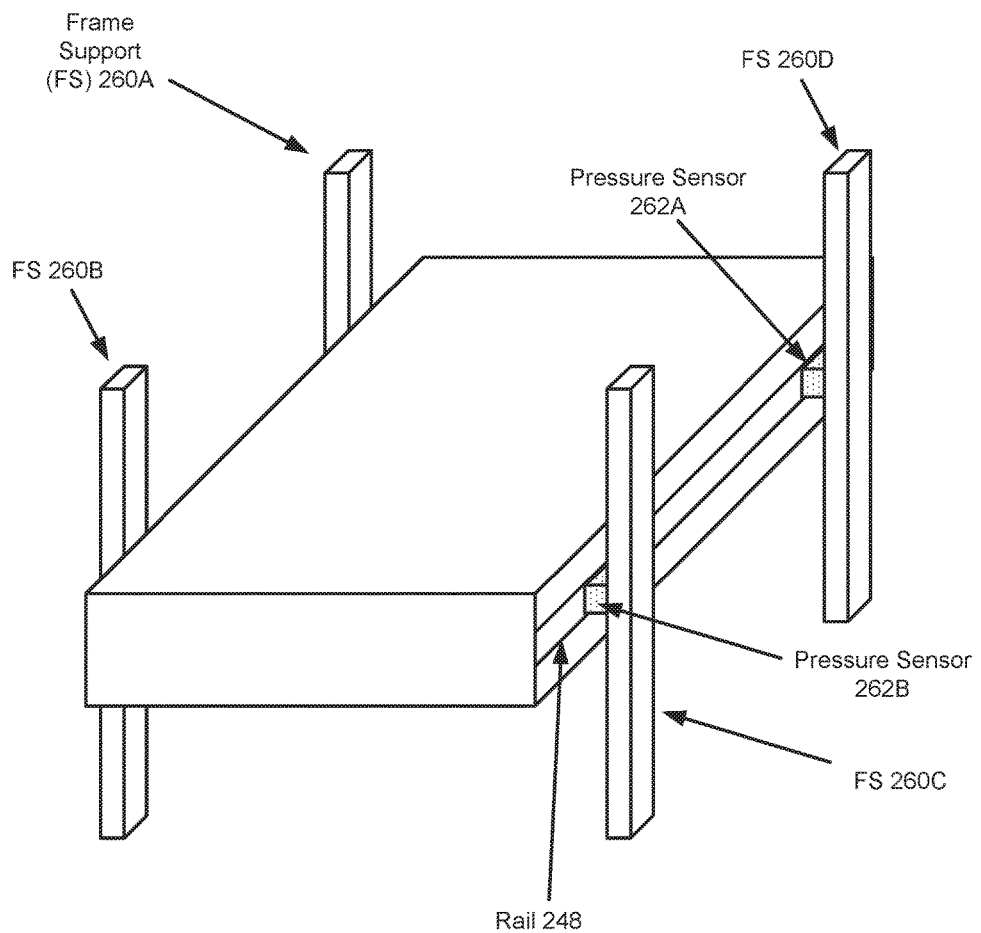
FIG. 2F shows a diagram of an example of rail mount chassis supported by frame supports in accordance with one or more embodiments of the invention.

FIG. 2F shows a diagram of an example placement of pressure sensors (262A, 262B) on a rail mount chassis in accordance with one or more embodiments of the invention. The rail mount chassis may be supported by frame supports (260A, 260B, 260C, 260D) which hold the rail mount chassis in place within a frame (not shown).

The rail mount chassis may be mechanically coupled to the frame supports (260A, 260B, 260C, 260D) via a rail (248) Pressure sensors (262A, 262B) may be disposed to measure the pressure applied to the frame supports by the rail mount chassis. For example, the pressure sensors may be disposed between the rail (248) and the frame supports (260A, 260B, 260C, 260D). In the aforementioned configuration, pressure applied to the rail mount chassis may be, in turn, applied to the frame supports (260A, 260B, 260C, 260D). Thus, in the aforementioned configuration the pressure sensors (262A, 262B) may measure pressure applied to the rail mount chassis.

For example, when a load is applied on the top of the rail mount chassis, the applied load is transmitted to the frame supports (260A, 260B, 260C, 260D). The pressure sensors (262A, 262B) may measure the load applied by to the frame supports (260D, 260C) by the rail mount chassis.

As discussed above, when pressure is applied to a rail mount chassis measurements of the applied pressure may be transmitted to a coordination point.

Figure 3:
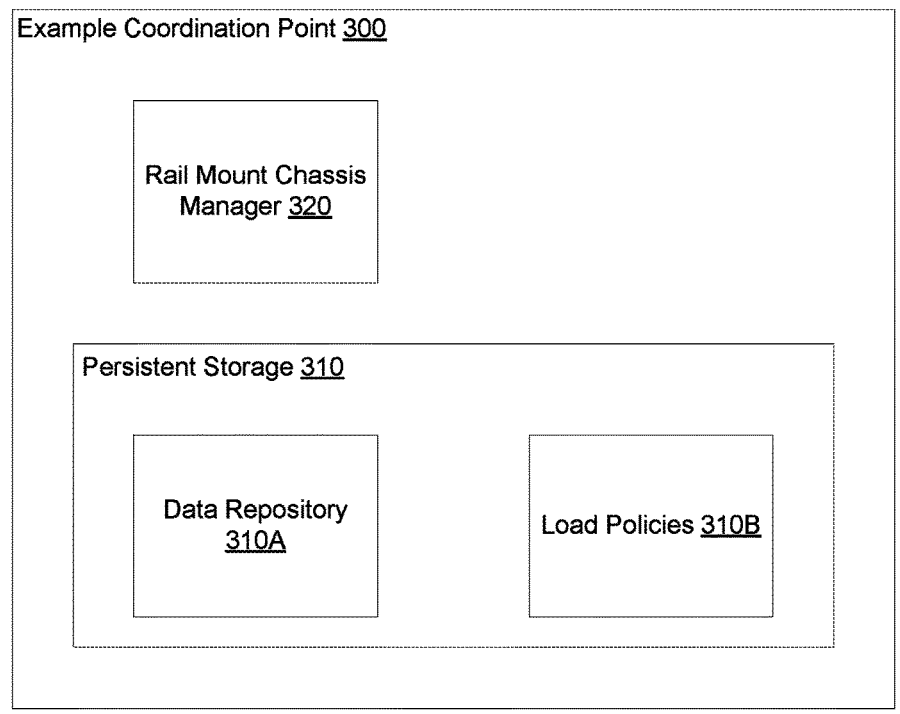
FIG. 3 shows a diagram of an example coordination point in accordance with one or more embodiments of the invention.

FIG. 3 shows a diagram of an example coordination point (300) in accordance with one or more embodiments of the invention. The example coordination point (300) may be similar to the example coordination point (100, FIG. 1) discussed above. As discussed above, the example coordination point (300) may manage a distributed system (e.g., 110, FIG. 1) by obtaining pressure sensor data and performing remediation actions based on the pressure sensor data. To perform the aforementioned functionality, the example coordination point (300) may include a rail mount chassis manager (320) and a persistent storage (310). The persistent storage (310) may include data structures, such as a data repository (310A) and load policies (310B), utilized by the rail mount chassis manager (320). Each component of the example coordination point (300) is discussed below.

In one or more embodiments of the invention, the rail mount chassis manager (320) obtains notifications regarding pressure applied to rail mount chassis. In response to the notifications, the rail mount chassis manager (320) may perform remediation actions if the notifications indicate that a pressure applied to a rail mount chassis meets a requirement of a load policy (310B). The notifications may be stored in the data repository (310A) in the persistent storage (310).

In one or more embodiments of the invention, the notifications are obtained from rail mount chassis, or via other devices such as network components. The notifications may include pressure sensor data. The notifications may include an estimated rail state of the rail mount chassis. The estimated rail state may include a comparison between an estimated load of a rail mount chassis and a load rating of the rail of the rail mount chassis that generated the notification. The estimated load may be a measurement of an applied load on a rail mount chassis. The rail load rating may be a critical load that, when exceeded, might result in damage to the rail mount chassis. For example, exceeding the rail rating may damage the rail and, consequently, cause the rail mount chassis to strike other components or otherwise become damaged.

In one or more embodiments of the invention, the rail mount chassis manager (320) may perform an area check when a rail mount chassis has been identified as potentially damaged. To perform an area check, pressure sensor data from other rail mount chassis proximate to the likely damaged rail mount chassis may be obtained. The obtained data may be processed to determine if other nearby rail mount chassis may have been damaged by the activity that led to the damage of the likely damaged rail mount chassis.

In one or more embodiments of the invention, the rail mount chassis manager (320) is a physical device. The physical device may include circuitry. The physical device may be, for example, a field-programmable gate array, application specific integrated circuit, programmable processor, microcontroller, digital signal processor, or other hardware processor. The physical device may be adapted to provide the functionality of the rail mount chassis manager (320) described throughout this application and/or all or a portion of the methods illustrated in FIGS. 6A-6D.

In one or more embodiments of the invention, the rail mount chassis manager (320) is implemented as computer instructions (e.g. computer code) stored on a persistent storage that when executed by a processor of the example coordination point (300) cause the example coordination point (300) to provide the functionality of the rail mount chassis manager (320) described throughout this application and/or all or a portion of the methods illustrated in FIGS. 6A-6D.

The persistent storage (310) may store data and may be, for example, hard disk drives, solid state drives, tape drives, or any combination thereof. The persistent storage (310) maybe other types of digital storage without departing from the invention. Additionally, the persistent storage (310) may store program code for user applications.

The persistent storage (310) may include data structures used by the rail mount chassis manager (320). The data structures may include a data repository (310A) and/or load policies (310B). The persistent storage (310) may include additional, fewer, and/or different data structures without departing from the invention. Each of the aforementioned data structures is discussed below.

In one or more embodiments of the invention, the data repository (310A) is a data structure that stores pressure sensor data. The pressure sensor data may be obtained from one or more rail mount chassis (i.e., 110A, 110N, FIG. 1). The pressure sensor data in the data repository (310A) may be utilized by the rail mount chassis manager (320) to estimate the state of a rail from a rail mount chassis. The data repository (310A) may store additional or different data without departing from the invention.

In one or more embodiments of the invention, the load policies (310B) are a data structure that includes sets of instructions that are to be implemented according to predetermined conditions. The predetermined conditions may be estimated rail states. For additional details regarding the load policies (310B), See FIG. 4.

Figure 4:
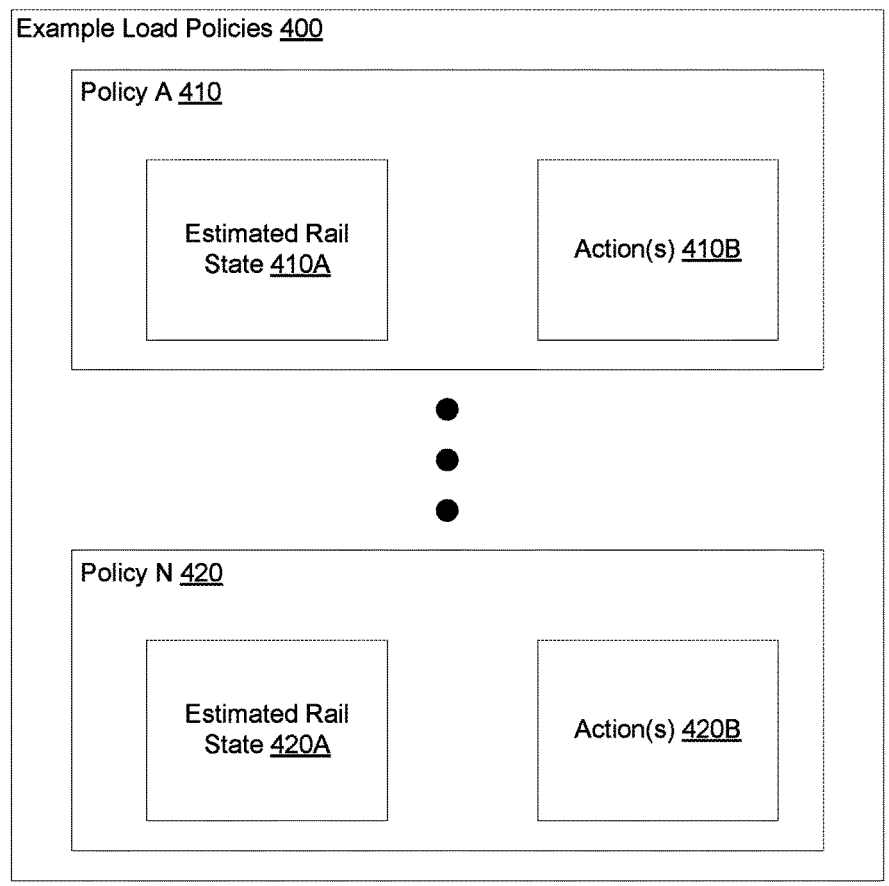
FIG. 4 shows a diagram of example load policies in accordance with one or more embodiments of the invention.

FIG. 4 shows a diagram of example load policies (400) in accordance with one or more embodiments of the invention. The load policies (310B, FIG. 3) discussed above may be similar to the example load policies (400).

In one or more embodiments of the invention, the example load policies (400) are a data structure that includes sets of instructions associated with predetermined conditions. The example load policies (400) may include any number of policies (410, 420). Each policy may include an estimated rail state (e.g., 410A, 420A), i.e., predetermined condition, and action(s) (e.g., 410B, 420B), i.e., instructions, associated with the estimated rail state (410A, 420A). Each portion of the example load policies (400) is discussed below.

In one or more embodiments of the invention, the estimated rail state (410A, 420A) specifies a state of a rail on a rail mount chassis. An estimated rail state (410A, 420A) may be, for example, damaged, in danger of being damaged, away from danger, or other states without departing from the invention. If the estimated state of a rail from a rail mount chassis matches an estimated rail state (410A, 420A), the associated action(s) may be performed.

In one or more embodiments of the invention, action(s) (410B, 420B) are actions that are performed when a rail of a rail mount chasses is in a state that matches the estimated rail state (410A, 420A) of a policy. The action(s) (410B, 420B) may be, for example, displaying a light pattern, playing a sound pattern, and/or sending a notification to a user via a coordination point (e.g., 100, FIG. 1). In one or more embodiments of the invention, action(s) (410B, 420B) are performed to warn a user of an excessive load applied to a rail mount chassis. As discussed above, an excessive load may damage the rail mount chassis and/or components disposed within the rail mount chassis. In one or more embodiments of the invention, action(s) (410B, 420B) are performed to inform a user when the pressure sensor data from a rail mount chassis is statistically different from other rail mount chassis.

As discussed above, the example rail mount chassis (200, FIG. 2) may perform methods for monitoring applied load on the example rail mount chassis (200, FIG. 2).

Figure 5A:
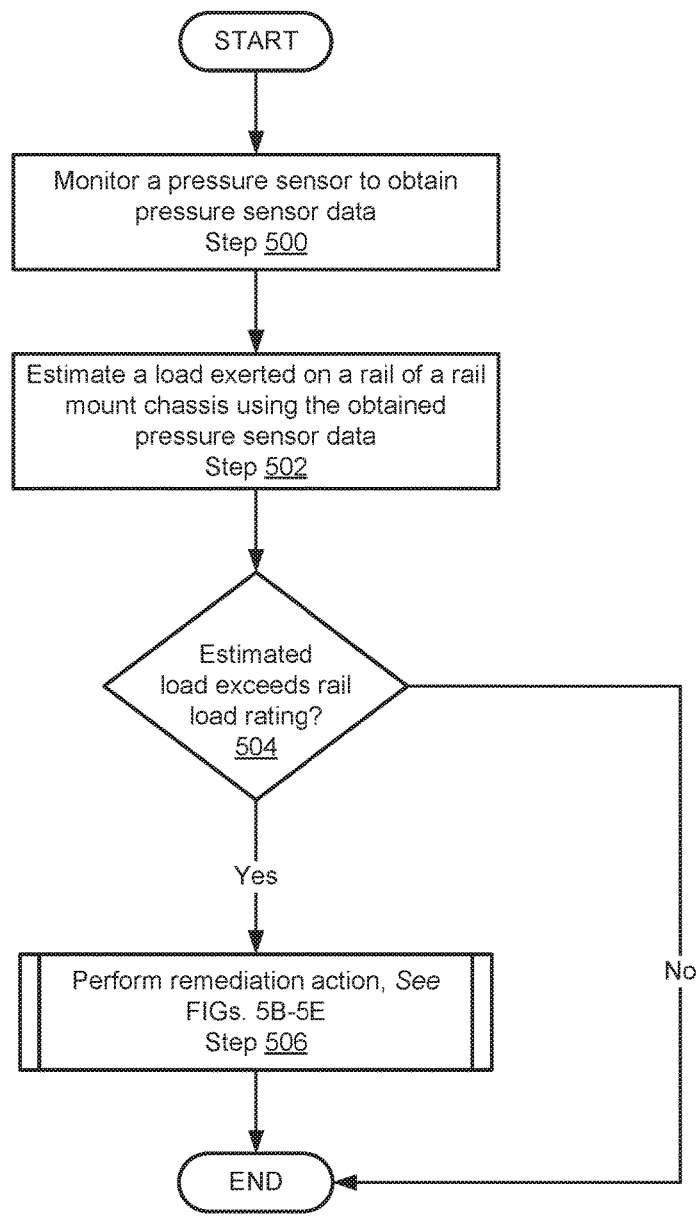
FIG. 5A shows a flowchart of a method of monitoring a rail mount chassis for damage in accordance with one or more embodiments of the invention.

FIG. 5A shows a flowchart of a method in accordance with one or more embodiments of the invention. The method depicted in FIG. 5A may be used to monitor load applied to a rail mount chassis and perform remediation actions in accordance with one or more embodiments of the invention. The method shown in FIG. 5A may be performed by, for example, a rail mount chassis (e.g. 110A, 110N, FIG. 1). Other components of the system illustrated in FIG. 1 may perform the method of FIG. 4A without departing from the invention.

In Step 500, a pressure sensor is monitored to obtain pressure sensor data.

In one or more embodiments of the invention, the rail mount chassis monitors a pressure sensor by obtaining pressure sensor data from a pressure sensor of the rail mount chassis. In one or more embodiments of the invention, the pressure sensor is disposed on a top portion of the rail mount chassis. The pressure sensor may be disposed at other locations without departing from the invention. Pressure sensor data may be obtained from multiple pressure sensors without departing from the invention. In such a scenario, averaging or other statistical methods of analyzing data from multiple sensors may be applied to the raw pressure sensor data to obtain the pressure sensor data.

The pressure sensor data may estimate an applied load on the pressure sensor. If an applied load exceeds a predetermined threshold, the applied load may cause damage to the rail mount chassis or components disposed in or associated with the rail mount chassis, such as, for example, a frame which may house the rail mount chassis, a computing device disposed within the rail mount chassis, and/or cabling that operably connects components disposed within the rail mount chassis to other components disposed outside of the rail mount chassis. In particular, if a user steps on a portion of the top of the rail mount chassis, a load may be applied that exceeds the predetermined threshold.

In Step 502, a load exerted on a rail of a rail mount chassis is estimated using the obtained pressure sensor data.

In one or more embodiments of the invention, the obtained pressure sensor data is related to the applied load on the pressure sensor of a rail mount chassis. The obtained pressure sensor data may have values that are proportional to the load applied to a rail via the rail mount chassis. Thus, the pressure sensor data may be used to estimate a load on the rail of a rail mount chassis. The actual load applied may be determined using the particular geometry of the rail mount chassis, attachment points, and other mechanical considerations.

In Step 504, it is determined whether the estimated load exceeds a rail load rating. If the estimated load does not exceed the rail load rating, the method may end following Step 504. If the estimated load exceeds the rail load rating, the method may proceed to Step 506.

In one or more embodiments of the invention, the rail load rating is a predetermined load that a rail of a rail mount chassis may support before critical damage is done to the rail. The estimated load may be compared to the rail load rating to determine whether remediation actions are to be performed.

In Step 506, remediation actions are performed.

In one or more embodiments of the invention, remediation actions are actions that performed when a load rating of a rail is exceeded. In other words, actions that are performed when the system detects that it is likely that a rail has been damaged. For additional details regarding remediation actions, See FIGS. 5B-5E.

The method may end following Step 506.

Figure 5B:
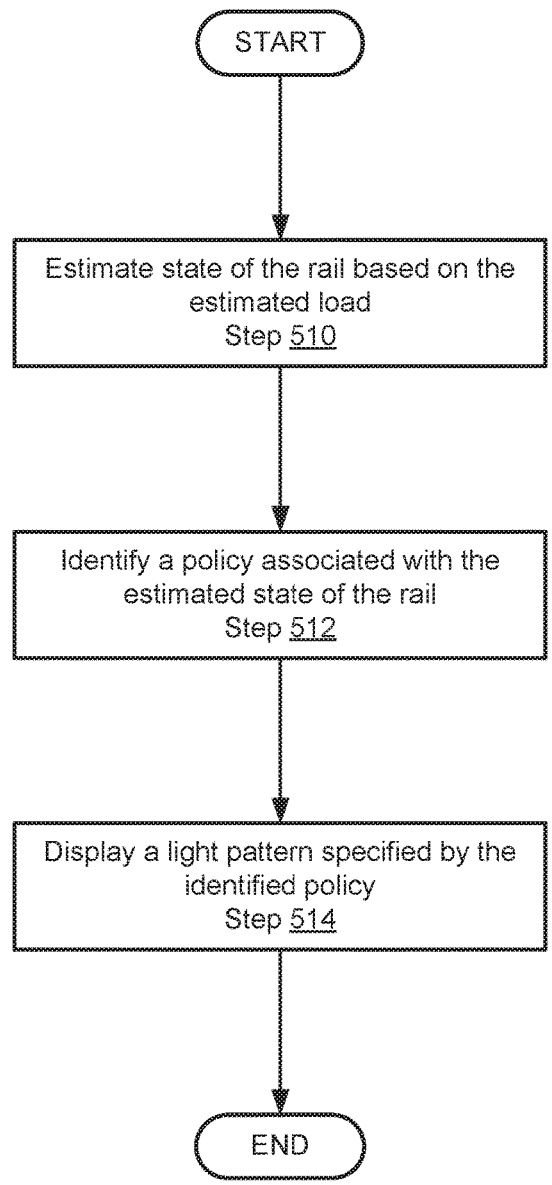
FIG. 5B shows a flowchart of a first method of performing remediation actions in accordance with one or more embodiments of the invention.

FIG. 5B shows a flowchart of a method in accordance with one or more embodiments of the invention. The method depicted in FIG. 5B may be used to perform remediation actions in accordance with one or more embodiments of the invention. The method shown in FIG. 5B may be performed by, for example, a computing device (220, FIG. 2) of a rail mount chassis. Other components of the system illustrated in FIG. 1 may perform the method of FIG. 5B without departing from the invention.

In Step 510, a state of the rail is estimated based on the estimated load.

In one or more embodiments of the invention, the state of the rail is estimated by comparing the estimated load applied to a rail to the rail load rating. An example of the estimated state of the rail may include critically damaged, in danger of critical damage, or safe from damage.

In Step 512, a policy associated with the estimated state of the rail is identified.

In one or more embodiments of the invention, the state of the rail is matched to a load policy, e.g., FIG. 4. Each load policy may include one or more actions associated with an estimated state of a rail. If the estimated state of the rail of the rail mount chassis matches the estimated state of the rail associated with a load policy, the policy may be identified by the rail mount chassis.

In Step 514, a light pattern specified by the identified policy is displayed.

In one or more embodiments of the invention, the light pattern is generated by a light emitting device (e.g. 245, FIG. 2C) of the rail mount chassis. The identified policy may specify, for example, the intensity of the light, the color of the light, the frequency of the light blinking, and/or any other characteristics of the light pattern without departing from the invention.

The method may end following Step 514.

Figure 5C:
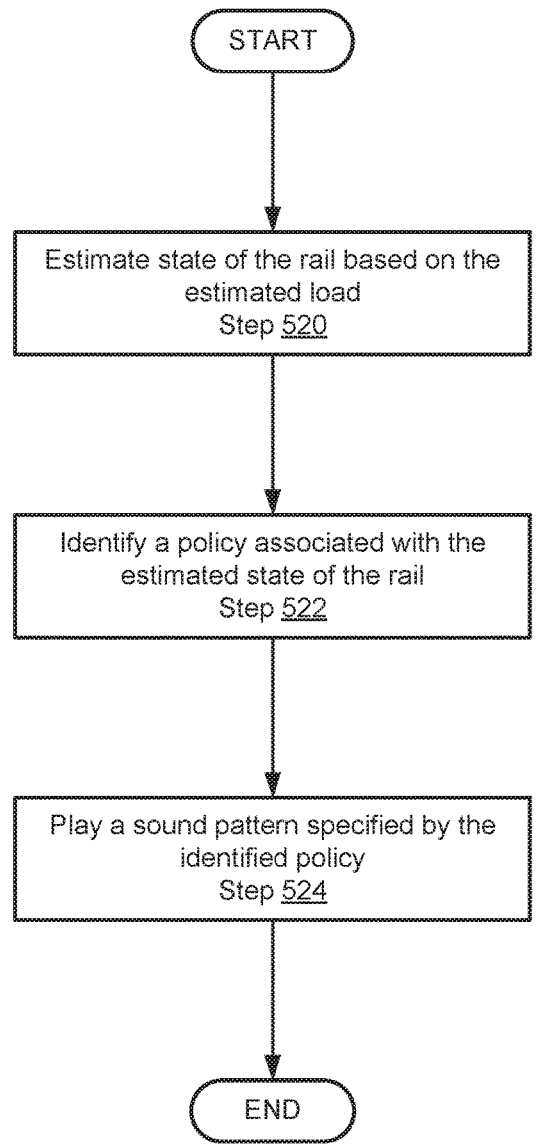
FIG. 5C shows a flowchart of a second method of performing remediation actions in accordance with one or more embodiments of the invention.

FIG. 5C shows a flowchart of a method in accordance with one or more embodiments of the invention. The method depicted in FIG. 5C may be used to perform remediation actions in accordance with one or more embodiments of the invention. The method shown in FIG. 5C may be performed by, for example, a computing device (220, FIG. 2) of a rail mount chassis. Other components of the system illustrated in FIG. 1 may perform the method of FIG. 5C without departing from the invention.

In Step 520, a state of the rail is estimated based on the estimated load.

In one or more embodiments of the invention, the state of the rail is estimated by comparing the estimated load applied to a rail to the rail load rating. An example of the estimated state of the rail may include critically damaged, in danger of critical damage, or safe from damage.

In Step 522, a policy associated with the estimated state of the rail is identified.

In one or more embodiments of the invention, the state of the rail is matched to a load policy, e.g., FIG. 4. Each load policy may include one or more actions associated with an estimated state of a rail. If the estimated state of the rail of the rail mount chassis matches the estimated state of the rail associated with a load policy, the policy may be identified by the rail mount chassis.

In Step 524, a sound pattern specified by the identified policy is played.

In one or more embodiments of the invention, the sound pattern is played via a sound emitting device of the rail mount chassis. Other sound emitting devices may play the sound pattern without departing from the invention. The identified policy may specify, for example, the volume of the sound, the frequency of the sound, and/or any other characteristics of the sound pattern without departing from the invention.

The method may end following Step 524.

Figure 5D:
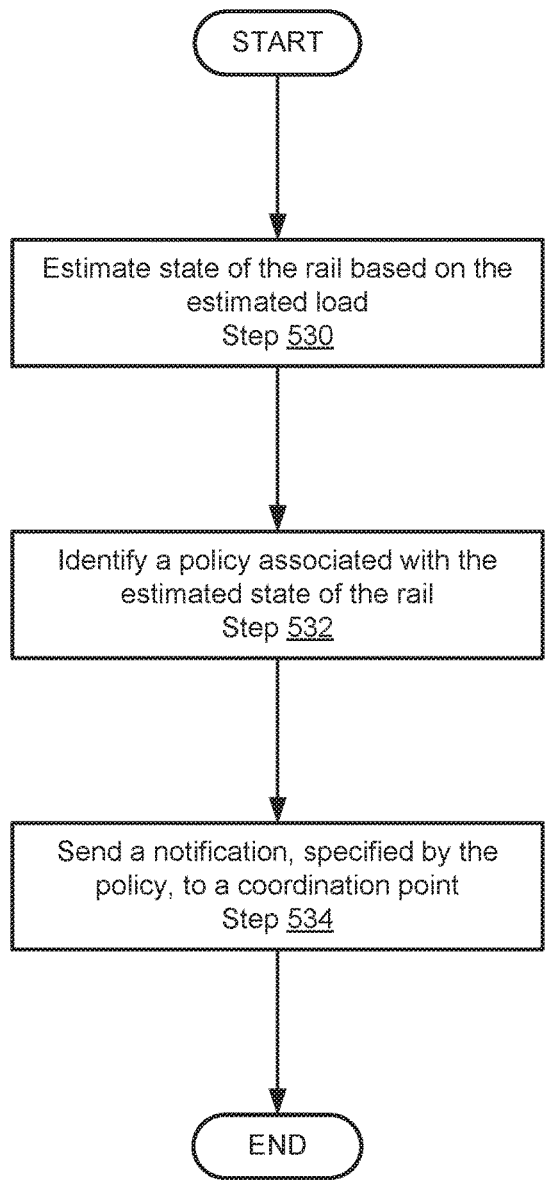
FIG. 5D shows a flowchart of a third method of performing remediation actions in accordance with one or more embodiments of the invention.

FIG. 5D shows a flowchart of a method in accordance with one or more embodiments of the invention. The method depicted in FIG. 5D may be used to perform remediation actions in accordance with one or more embodiments of the invention. The method shown in FIG. 5D may be performed by, for example, a computing device (220, FIG. 2) of a rail mount chassis. Other components of the system illustrated in FIG. 1 may perform the method of FIG. 5D without departing from the invention.

In Step 530, a state of the rail is estimated based on the estimated load.

In one or more embodiments of the invention, the state of the rail is estimated by comparing the estimated load applied to a rail to the rail load rating. An example of the estimated state of the rail may include critically damaged, in danger of critical damage, or safe from damage.

In Step 532, a policy associated with the estimated state of the rail is identified.

In one or more embodiments of the invention, the state of the rail is matched to a load policy, e.g., FIG. 4. Each load policy may include one or more actions associated with an estimated state of a rail. If the estimated state of the rail of the rail mount chassis matches the estimated state of the rail associated with a load policy, the policy may be identified by the rail mount chassis.

In Step 534, a notification specified by the identified policy is sent to a coordination point.

In one or more embodiments of the invention, the notification includes information about the state of a rail in a rail mount chassis. The notification may include the obtained pressure sensor data. The notification may be sent to a coordination point and/or a user. The notification may be sent to other entities without departing from the invention.

The method may end following Step 534.

Figure 5E:
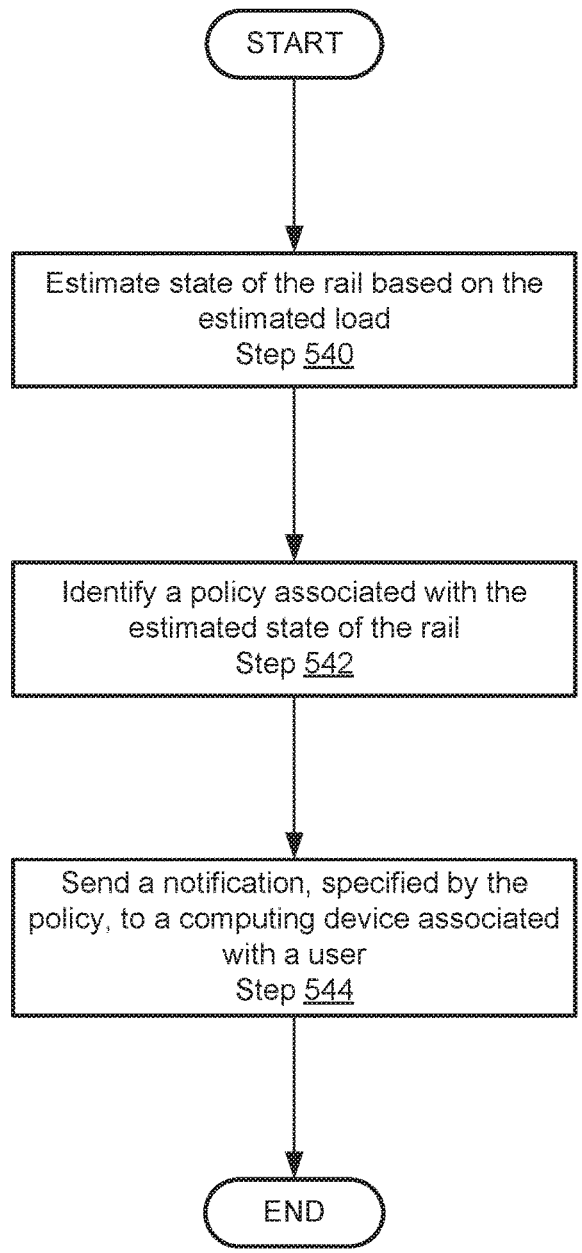
FIG. 5E shows a flowchart of a fourth method of performing remediation actions in accordance with one or more embodiments of the invention.

FIG. 5E shows a flowchart of a method I accordance with one or more embodiments of the invention. The method depicted in FIG. 5E may be used to perform remediation actions in accordance with one or more embodiments of the invention. The method shown in FIG. 5E may be performed by, for example, a computing device (220, FIG. 2) of a rail mount chassis. Other components of the system illustrated in FIG. 1 may perform the method of FIG. 5E without departing from the invention.

In Step 540, a state of the rail is estimated based on the estimated load.

In one or more embodiments of the invention, the state of the rail is estimated by comparing the estimated load applied to a rail to a rail load rating. The state of the rail may be, for example, critically damaged, in danger of critical damage, or safe from damage.

In Step 542, a policy associated with the estimated state of the rail is identified.

In one or more embodiments of the invention, the state of the rail is matched to a load policy, e.g., FIG. 4. Each load policy may include one or more actions associated with an estimated state of a rail. If the estimated state of the rail of the rail mount chassis matches the estimated state of the rail associated with a load policy, the policy may be identified by the rail mount chassis.

In Step 544, a notification specified by the identified policy is sent to a computing device associated with a user.

In one or more embodiments of the invention, the notification includes information about the state of a rail in a rail mount chassis. The notification may include the obtained pressure sensor data. A user may receive the notification from the computing device and take appropriate action.

For example, a user that receives a notification may take action by inspecting the rail mount chassis. Inspecting the rail mount chassis may enable the user to verify whether the rail mount chassis was damaged due to the applied load.

In one or more embodiments of the invention, the notification is a text message, email, instant message, and/or other type of electronic message. The notification may be sent via multiple mediums, e.g., via both email and text, without departing from the invention.

In one or more embodiments of the invention, the computing device is a smart phone, personal computer, tablet computer, or workstation. The computing device may be other types of computing devices without departing from the invention.

The method may end following Step 544.

As discussed above, a coordination point may perform methods for managing a number of rail mount chassis.

Figure 6A:
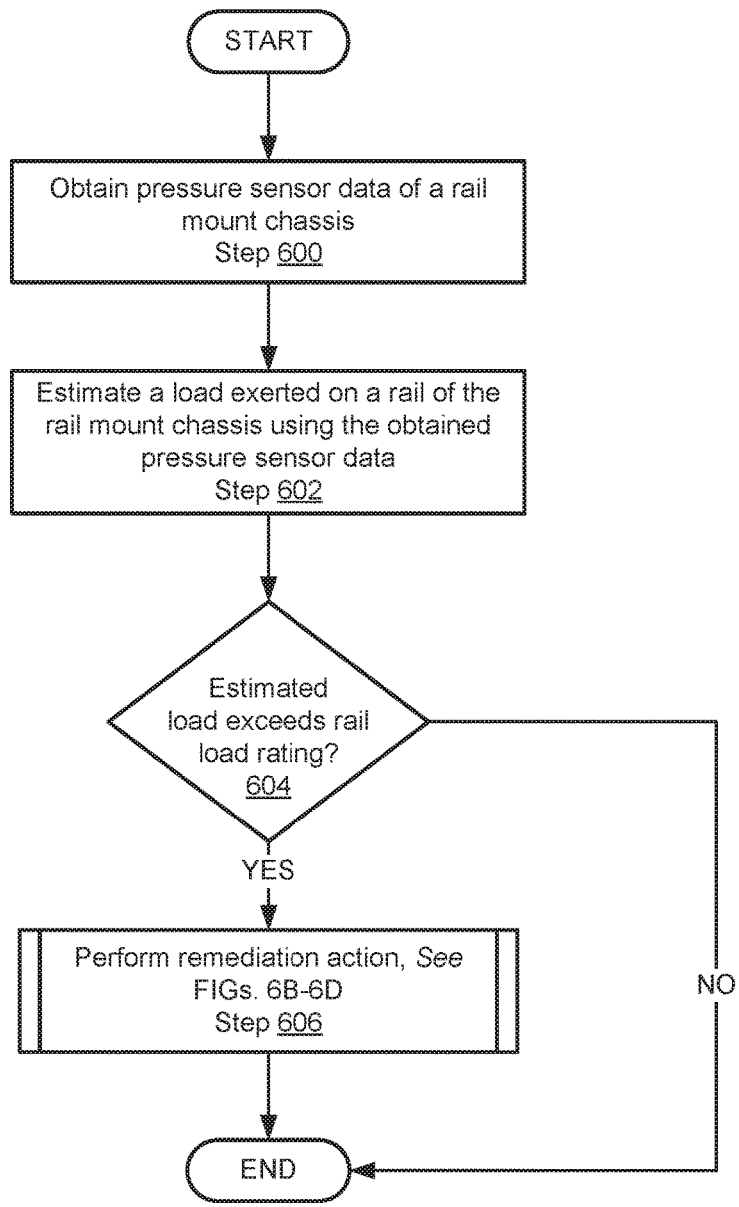
FIG. 6A shows a flowchart of a method of remotely monitoring a rail mount chassis for damage in accordance with one or more embodiments of the invention.

FIG. 6A shows a flowchart of a method in accordance with one or more embodiments of the invention. The method depicted in FIG. 6A may be used to manage a number of rail mount chassis in accordance with one or more embodiments of the invention. The method shown in FIG. 6A may be performed by, for example, a coordination point (100, FIG. 1). Other components of the system illustrated in FIG. 1 may perform the method of FIG. 6A without departing from the invention.

In Step 600, a pressure sensor data of a rail mount chassis is obtained. The pressure sensor data may be obtained via a notification from the rail mount chassis.

In one or more embodiments of the invention, the obtained notification includes the pressure sensor data of a rail mount chassis. The pressure sensor data of a rail mount chassis may estimate a load applied to the rail mount chassis.

In Step 602, a load exerted on a rail of the rail mount chassis is estimated using the obtained pressure sensor data.

In Step 604, it is determined whether the estimated load exceeds a rail load rating. If the estimated load does not exceed rail load rating, the method may end following Step 604. If the estimated load exceeds rail load rating, the method may proceed to Step 606.

As discussed above, the rail load rating may be a predetermined load amount that a rail of a rail mount chassis may support before critical damage is done to the rail. The estimated load may be compared to the rail load rating to determine whether remediation actions are to be performed.

In Step 606, remediation actions are performed.

Figure 6B:
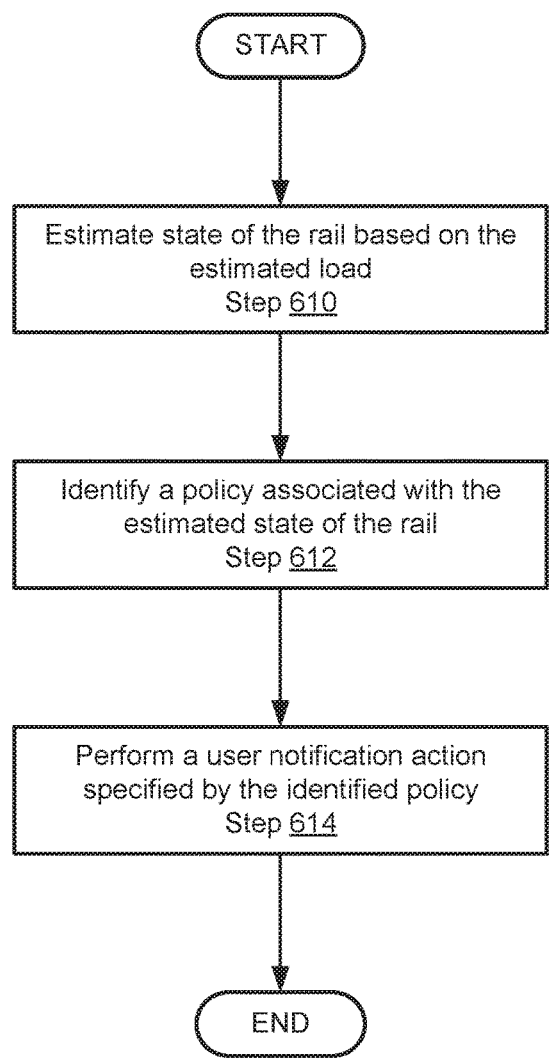
FIG. 6B shows a flowchart of a first method of remotely performing remediation actions in accordance with one or more embodiments of the invention.
Figure 6C:
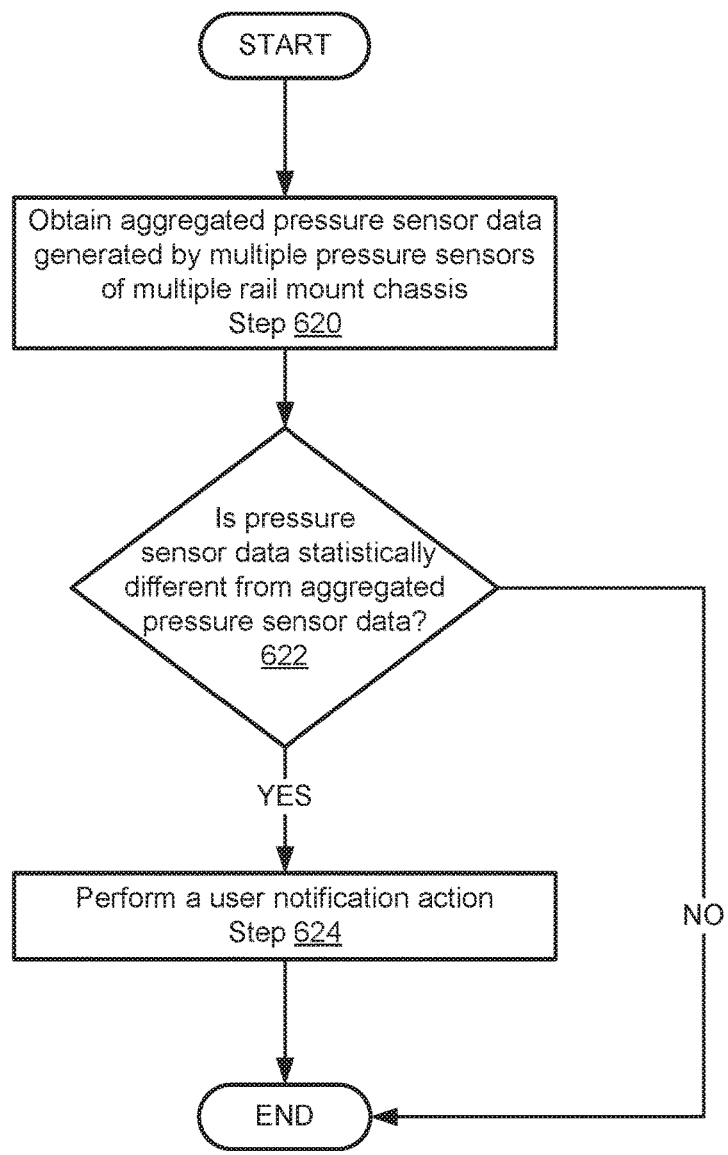
FIG. 6C shows a flowchart of a second method of remotely performing remediation actions in accordance with one or more embodiments of the invention.
Figure 6D:
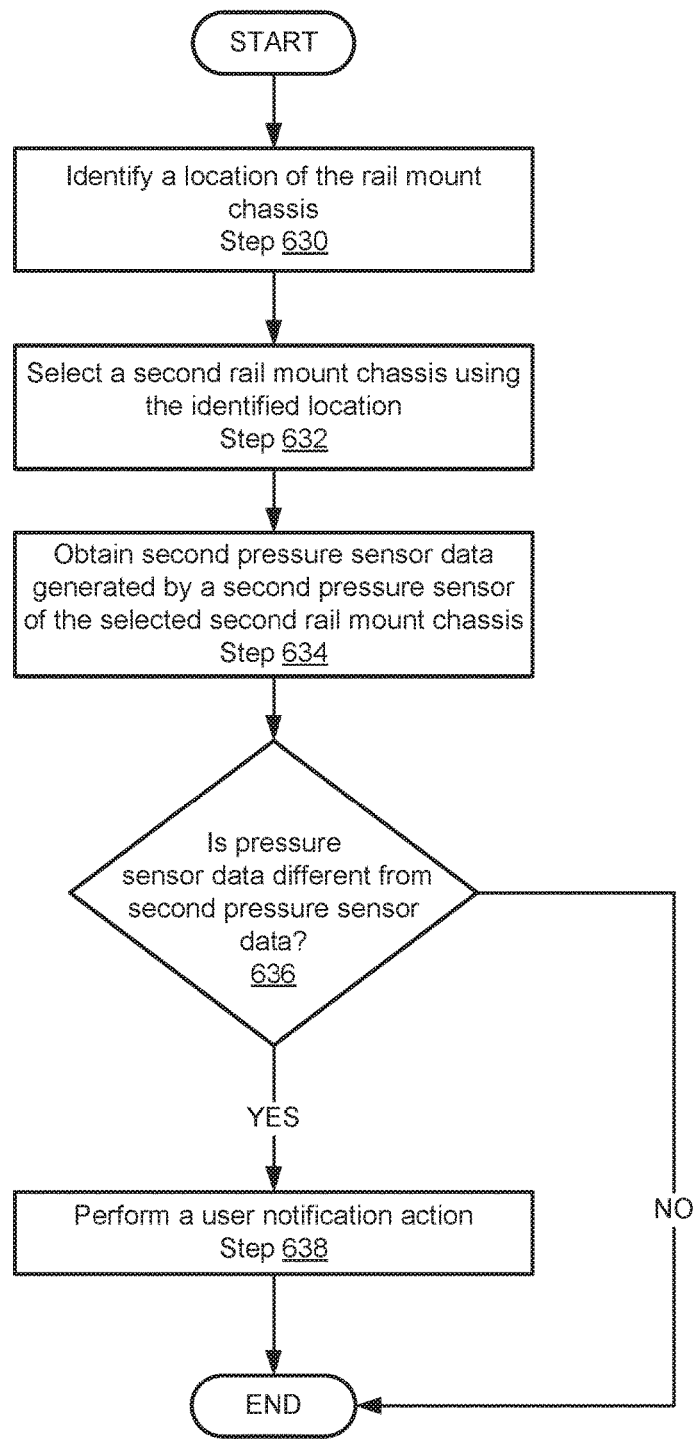
FIG. 6D shows a flowchart of a third method of remotely performing remediation actions in accordance with one or more embodiments of the invention.

In one or more embodiments of the invention, the remediation actions are performed via the methods illustrated in FIGS. 6B-6D. The remediation actions may be performed via other methods without departing from the invention.

The method may end following Step 606.

FIG. 6B shows a flowchart of a method in accordance with one or more embodiments of the invention. The methods depicted in FIG. 6B may be used to perform remediation actions in accordance with one or more embodiments of the invention. The method shown in FIG. 6B may be performed by, for example, a coordination point (100, FIG. 1). Other components of the system illustrated in FIG. 1 may perform the method of FIG. 6B without departing from the invention.

In Step 610, a state of the rail is estimated based on the estimated load.

In one or more embodiments of the invention, the state of the rail is estimated by comparing the estimated load to the rail load rating.

In Step 612, a policy associated with the estimated state of the rail is identified.

In one or more embodiments of the invention, the state of the rail is matched to a load policy, e.g., FIG. 4. Each load policy may include one or more actions associated with an estimated state of a rail. If the estimated state of the rail of the rail mount chassis matches the estimated state of the rail associated with a load policy, the policy may be identified by the coordination point.

In Step 614, a user notification action specified by the identified policy is performed.

In one or more embodiments of the invention, the user notification action is sending a notification to a user or other entity. The notification may include the state of the rail of the rail mount chassis. A notification action may be, for example, an email, a text message, and/or other forms of messages without departing from the invention.

As discussed above, a coordination point may perform methods for managing a number of rail mount chassis.

FIG. 6C shows a flowchart of a method in accordance with one or more embodiments of the invention. The methods depicted in FIG. 6C may be used to perform remediation actions in accordance with one or more embodiments of the invention. The method shown in FIG. 6C may be performed by, for example, a coordination point (100, FIG. 1). Other components of the system illustrated in FIG. 1 may perform the method of FIG. 6C without departing from the invention.

In Step 620, aggregated pressure sensor data generated by multiple pressure sensors of multiple rail mount chassis is obtained.

In one or more embodiments of the invention, the aggregated pressure sensor data is obtained by obtaining pressure sensor data from each of the multiple chassis and then aggregating the obtained data.

In one or more embodiments of the invention, the aggregated pressure sensor data is obtained from a data repository. As discussed in FIG. 3, a coordination point may include a data repository in the persistent storage. The data repository may include the pressure sensor data of multiple rail mount chassis.

In Step 622, it is determined whether pressure sensor data from a rail mount chassis is statistically different from the obtained aggregated pressure sensor data. If the pressure sensor data is statistically different from aggregated pressure sensor data, the method may proceed to Step 624. If the pressure sensor data is not statistically different from the aggregated pressure sensor data, the method may end following Step 622.

In one or more embodiments of the invention, a coordination point determines whether pressure sensor data is statistically different from the aggregated pressure sensor data by comparing an average of the aggregated pressure sensor data to the pressure sensor data of a single rail mount chassis. If the pressure sensor data of the single rail mount chassis is significantly different from the average, the coordination point may determine that the pressure sensor data was statistically different from the aggregated pressure sensor data.

Other statistical analysis methods may be used to determine whether the pressure sensor data from a single rail mount chassis is different from the aggregated pressure sensor data.

In one or more embodiments of the invention, the multiple rail mount chassis are located near the single rail mount chassis. For example, the multiple rail mount chassis may be the other rail mount chassis in a frame in which the single rail mount chassis is disposed. The multiple rail mount chassis may be located in adjacent frames or other nearby frames without departing from the invention. In other embodiments of the invention, the multiple rail mount chassis may be any combination of rail mount chassis, located near or away from each other, that each send notifications to a coordination point.

In Step 624, a user notification action is performed.

In one or more embodiments of the invention, the user notification action is sending a notification to a user or other entity. The notification may include the state of the rail of the rail mount chassis. A notification action may be, for example, an email, a text message, and/or other forms of messages without departing from the invention.

The method may end following Step 624.

FIG. 6D shows a flowchart of a method in accordance with one or more embodiments of the invention. The methods depicted in FIG. 6D may be used to perform remediation actions in accordance with one or more embodiments of the invention. The method shown in FIG. 6D may be performed by, for example, a coordination point (100, FIG. 1). Other components of the system illustrated in FIG. 1 may perform the method of FIG. 6D without departing from the invention.

In Step 630, a location of the rail mount chassis is identified.

In one or more embodiments of the invention, the location of the rail mount chassis is a frame in a data center that houses the rail mount chassis. A data center may include any number of frames.

In Step 632, a second rail mount chassis is selected using the identified location.

In one or more embodiments of the invention, the selected second rail mount chassis is housed in the same frame as the first rail mount chassis.

In Step 634, a second pressure sensor data generated by a second pressure sensor of the selected second rail mount chassis is obtained.

In Step 636, it is determined whether the pressure sensor data is different from the second pressure sensor data. If the pressure sensor data is not different from the second pressure sensor data, the method may end. If the pressure sensor data is different from the second pressure sensor data, the method may proceed to Step 638.

In Step 638, a user notification action is performed.

In one or more embodiments of the invention, the user notification action is sending a notification to a user or other entity. The notification may include the state of the rail of the rail mount chassis. A notification action may be, for example, an email, a text message, and/or other forms of messages without departing from the invention.

The method may end following Step 638.

Figure 7A:
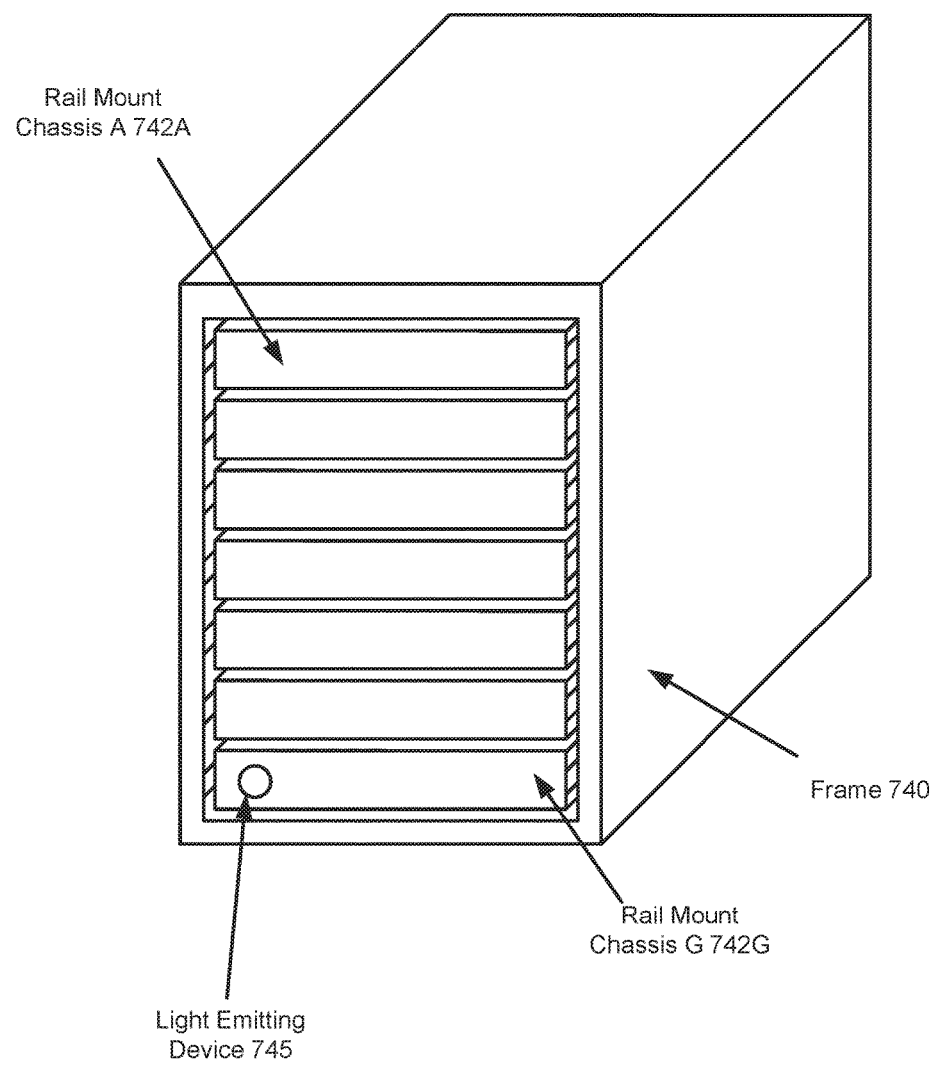
FIG. 7A shows a diagram of an example of rail mount storages in a frame.

To further clarify the invention, a non-limiting example is provided below and illustrated in FIGS. 7A-7B.

Example 1

Consider a scenario in which a rail mount chassis may need maintenance. FIG. 7A shows a diagram of a frame (740) housing multiple rail mount chassis (742A, 742G). A maintenance worker may attempt to perform maintenance work on a computing device housed in rail mount chassis A (742A). The maintenance worker may have difficulty performing maintenance work on rail mount chassis A (742A) due to its location within the frame (740). To reach the upper rail mount chassis A (742A), the maintenance worker may partially remove rail mount chassis G (742G) out of the frame (740) in order to step on it and thereby reach rail mount chassis A (742A).

Figure 7B:
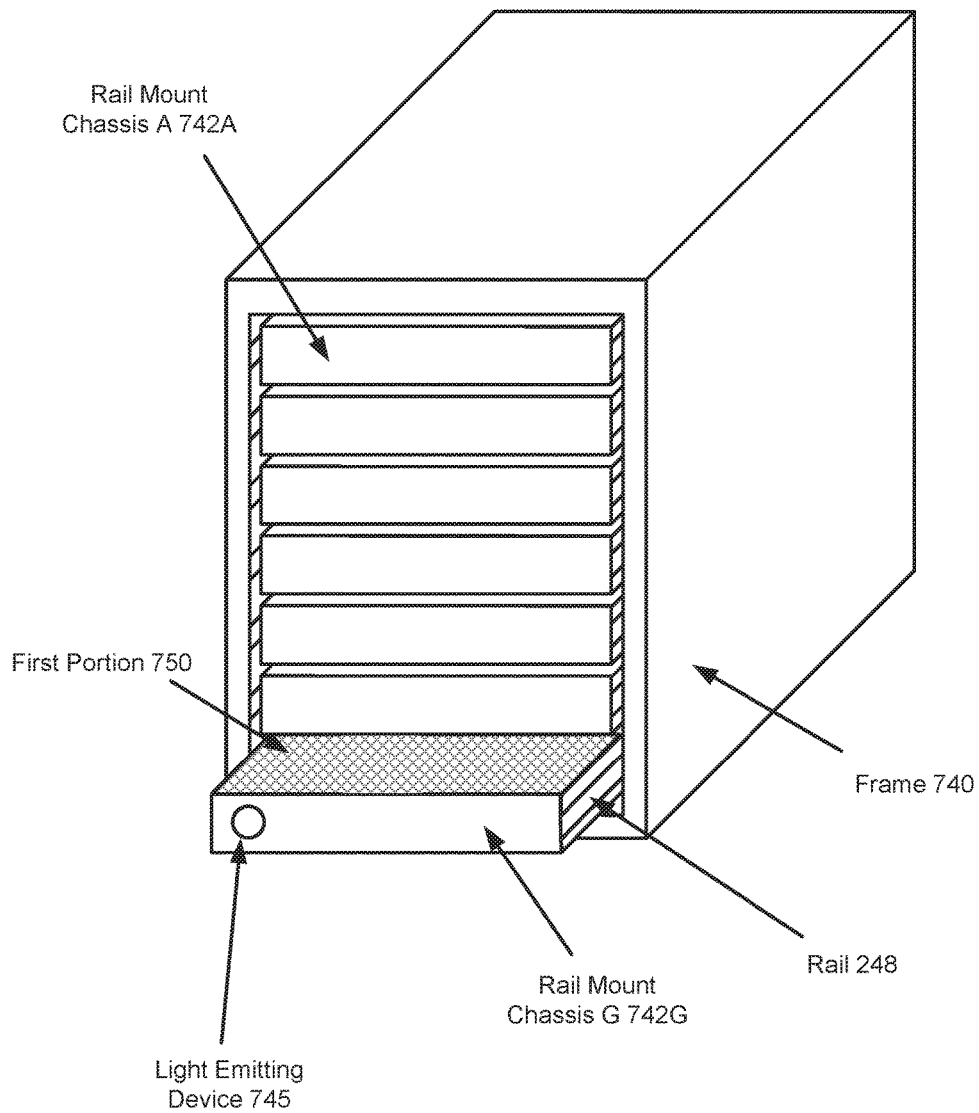
FIG. 7B shows a diagram of the example of FIG. 7A after a rail mount chassis has been partially exposed from the frame.

FIG. 7B shows a diagram of the frame (740) with rail mount chassis G (742G) partially exposed from the frame. In the position illustrated in FIG. 7B, rail mount chassis G (742G) may be utilized as a step in order to reach rail mount chassis A (742A).

Since the rail mount chassis G (742G) includes a pressure sensitive first portion (750), located on the top of rail mount chassis G (742G), the use of the rail mount chassis as a step may be detected.

When the maintenance worker may apply pressure to the first portion (750) by stepping on it, the application of the pressure is detected. As pressure is applied to the first portion, the pressure sensors mechanically coupled to the first portion (750) estimate a load on the rail (748) of rail mount chassis G (742G). When the estimated load exceeds a rail load rating of a rail (248) of the rail mount chassis G (742G), the rail mount chassis is able to detect that it has likely been damaged by the application of pressure by the maintenance worker.

In response to detecting that the rail mount chassis G (742G) has been damaged, the rail mount chassis G (742G) may perform a remediation action such as displaying a light pattern using a light emitting device (745) disposed on an exterior of the rail mount chassis G (742G).

End of Example 1

Figure 8:
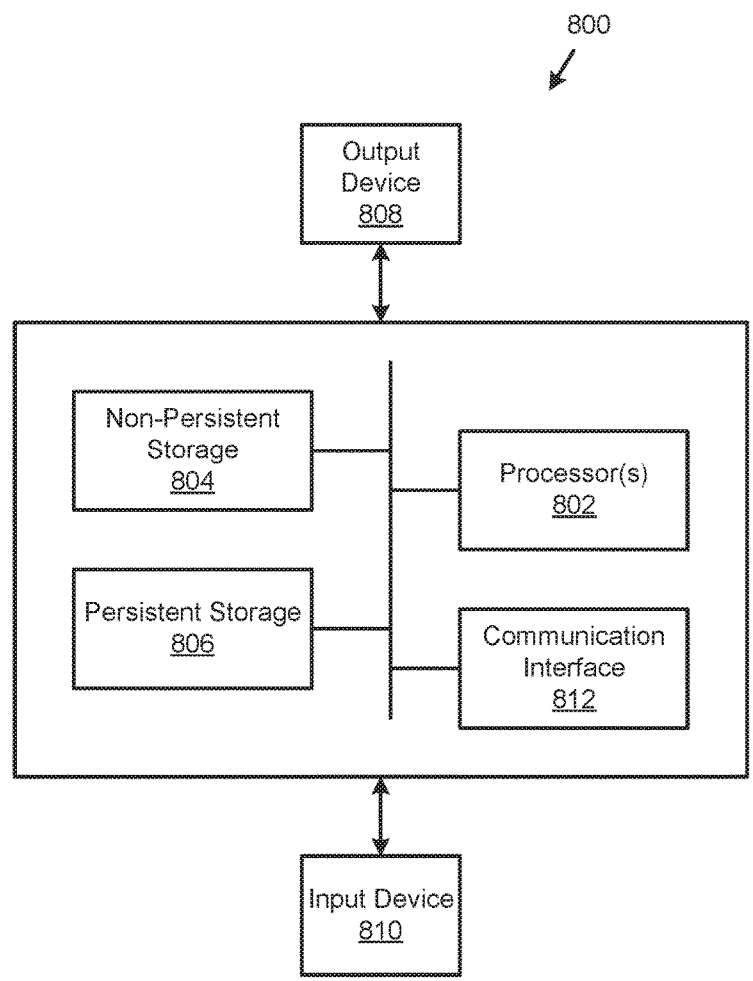
FIG. 8 shows a diagram of a computing device in accordance with one or more embodiments of the invention.

As discussed above, embodiments of the invention may be implemented using computing devices. FIG. 8 shows a diagram of a computing device in accordance with one or more embodiments of the invention. The computing device (800) may include one or more computer processors (802), non-persistent storage (804) (e.g., volatile memory, such as random access memory (RAM), cache memory), persistent storage (806) (e.g., a hard disk, an optical drive such as a compact disk (CD) drive or digital versatile disk (DVD) drive, a flash memory, etc.), a communication interface (812) (e.g., Bluetooth interface, infrared interface, network interface, optical interface, etc.), input devices (810), output devices (808), and numerous other elements (not shown) and functionalities. Each of these components is described below.

In one embodiment of the invention, the computer processor(s) (802) may be an integrated circuit for processing instructions. For example, the computer processor(s) may be one or more cores or micro-cores of a processor. The computing device (800) may also include one or more input devices (810), such as a touchscreen, keyboard, mouse, microphone, touchpad, electronic pen, or any other type of input device. Further, the communication interface (812) may include an integrated circuit for connecting the computing device (800) to a network (not shown) (e.g., a local area network (LAN), a wide area network (WAN) such as the Internet, mobile network, or any other type of network) and/or to another device, such as another computing device.

In one embodiment of the invention, the computing device (800) may include one or more output devices (808), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (802), non-persistent storage (804), and persistent storage (806). Many different types of computing devices exist, and the aforementioned input and output device(s) may take other forms.

Embodiments of the invention may improve the reliability of computing devices in data center, or other cluster environment. More specifically, embodiments of the invention may provide for the detection of potentially damaging amount of pressure applied to chassis of computing devices. The pressure may be detected via sensors disposed in predetermined locations on a chassis that are likely to be improperly used as stepping or reaching tools. For example, in a data center it may be difficult to reach the chassis of some of the computing devices. Portions of the chassis may be improperly used as steps to reach other chassis. Embodiments of the invention may enable such behavior by maintenance workers and automatically take action to remediate potential damage caused by the maintenance workers.

While embodiments of the invention have been described as addressing one or more problems, embodiments of the invention are applicable to address other problems and the scope of the invention should not be limited to addressing the problems specifically discussed throughout this application.

Throughout this application, elements of figures may be labeled as A to N. As used herein, the aforementioned labeling means that the element may include any number of items and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
   a rail mount chassis comprising a pressure sensor; and
   a processor programmed to:
      monitor the pressure sensor to obtain pressure sensor data;
      estimate a load exerted on a rail of the rail mount chassis using the obtained pressure sensor data;
      make a determination that the load exerted on the rail exceeds a load rating of the rail; and
      in response to the determination, notify a user that the rail may be damaged.

2. The computing device of claim 1, wherein the rail mount chassis further comprises:
   a top adapted to:
      allow access to computing resources of the rail mount chassis while the rail mount chassis is mounted in a frame; and
      transmit pressure applied to a first portion of the top to the pressure sensor.

3. The computing device of claim 2, wherein the top comprises:
   the first portion mechanically coupled to the pressure sensor; and
   a removable portion that is not coupled to the pressure sensor.

4. The computing device of claim 1, wherein the rail mount chassis further comprises:
   an enclosure adapted to house the processor; and
   a rail mount, coupled to the enclosure, adapted to:
      mount the rail to a frame,
      transmit a force between the rail and the frame to the pressure sensor.

5. The computing device of claim 1, further comprising:
   a light emitting device disposed on a front of the rail mount chassis adapted to be visible from an exterior of a frame when the rail mount chassis is disposed in the frame.

6. The computing device of claim 5, wherein notifying the user that the rail may be damaged comprises:
   displaying a light pattern using the light emitting device.

7. The computing device of claim 1, further comprising:
   a sound emitting device disposed on a portion of the rail mount chassis.

8. The computing device of claim 7, wherein notifying the user that the rail may be damaged comprises:
   playing a sound pattern using the sound emitting device.

9. The computing device of claim 1, wherein notifying the user that the rail may be damaged comprises:
   sending a notification to a coordination point,
   wherein the notification comprises:
      the obtained pressure sensor data,
      an identifier of the rail mount chassis.

10. A coordination point, comprising:
   a persistent storage storing load policies; and
   a processor programmed to:
      obtain notification from a rail mount chassis, wherein the notification comprises pressure sensor data generated by a sensor of the rail mount chassis;
      make a determination that the pressure sensor data exceeds a pressure rating of a rail of the rail mount chasses;
      in response to the determination, perform a remediation action using the load policies.

11. The coordination point of claim 10, wherein the remediation action comprises:
   illuminating a light source of the rail mount chassis.

12. The coordination point of claim 10, wherein the remediation action comprises:
   playing a sound pattern using a sound emitting device of the rail mount chassis.

13. The coordination point of claim 10, wherein the remediation action comprises:
   obtaining aggregated pressure sensor data generated by a plurality of pressure sensors of a plurality of rail mount chassis;
   making a second determination that the pressure sensor data is statistically different from the aggregated pressure sensor data; and
   in response to the second determination, notify a user that the rail may be damaged.

14. The coordination point of claim 13, wherein making the second determination that the pressure sensor data is statistically different from the aggregated pressure sensor data comprises:
   obtaining an average of the aggregated pressure sensor data;
   making a second determination that the pressure sensor data is different from the aggregated pressure sensor data using the average of the aggregated pressure sensor data.

15. The coordination point of claim 13, wherein making the second determination that the pressure sensor data is statistically different from the aggregated pressure sensor data comprises:
   obtaining a standard of deviation of the aggregated pressure sensor data;
   making a second determination that the pressure sensor data is within the obtained standard of deviation.

16. The coordination point of claim 10, wherein the remediation action comprises:
   obtaining aggregated pressure sensor data generated by a plurality of pressure sensors of a plurality of rail mount chassis; and
   making a second determination that the pressure sensor data is not statistically different from the aggregated pressure sensor data.

17. The coordination point of claim 10, wherein the remediation action comprises:
   identifying a location of the rail mount chassis;
   selecting a second rail mount chassis using the identified location;
   obtaining pressure sensor data from the selected second rail mount chassis.

18. The coordination point of claim 10, wherein location of the rail mount chassis is a frame in which the rail mount chassis is mounted, wherein selecting the second rail mount chassis using the identified location comprises selecting any one of a plurality of rail mount chassis mounted in the frame.

19. A method, comprising:
   monitoring a pressure sensor of a rail mount chassis to obtain pressure sensor data;
   estimating a load exerted on a rail of the rail mount chassis using the obtained pressure sensor data;
   making a determination that the estimated load exerted on the rail exceeds a load rating of the rail; and
   in response to the determination, performing a remediation action.

20. The method of claim 19, wherein the remediation action comprises notifying a user.

* * * * *